(12) United States Patent
Wenzel et al.

(10) Patent No.: US 7,190,965 B2
(45) Date of Patent: Mar. 13, 2007

(54) APPARATUS AND METHOD FOR STABILIZATION OF THE TRANSMISSION POWER OF RADIOS

(75) Inventors: Dietmar Wenzel, München (DE); Robert Würth, München (DE); Stefan Herzinger, München (DE)

(73) Assignee: Infineon Technologies AG, Munich (DE)

( * ) Notice: Subject to any disclaimer, the term of this patent is extended or adjusted under 35 U.S.C. 154(b) by 206 days.

(21) Appl. No.: 10/482,453

(22) PCT Filed: Jul. 4, 2002

(86) PCT No.: PCT/DE02/02450

§ 371 (c)(1),
(2), (4) Date: Jul. 15, 2004

(87) PCT Pub. No.: WO03/005601

PCT Pub. Date: Jan. 16, 2003

(65) Prior Publication Data

US 2004/0240582 A1    Dec. 2, 2004

(30) Foreign Application Priority Data

Jul. 4, 2001 (DE) ................................. 101 32 352

(51) Int. Cl.
*H04B 7/00* (2006.01)
*H04Q 7/20* (2006.01)

(52) U.S. Cl. .................. 455/522; 455/115.1; 455/116; 455/127.1

(58) Field of Classification Search ............. 455/115.1, 455/116, 127.1, 127.2, 522
See application file for complete search history.

(56) References Cited

U.S. PATENT DOCUMENTS

| 4,602,218 A | | 7/1986 | Vilmur et al. |
| 5,408,197 A | | 4/1995 | Miyake |
| 5,548,616 A | * | 8/1996 | Mucke et al. ................ 375/295 |
| 5,697,074 A | | 12/1997 | Makikallio et al. |
| 5,737,697 A | | 4/1998 | Yamada |
| 5,832,374 A | * | 11/1998 | Birth et al. ............... 455/127.2 |
| 6,792,282 B1 | * | 9/2004 | Domino et al. ............. 455/522 |

FOREIGN PATENT DOCUMENTS

| DE | 692 09 206 T2 | 10/1996 |
| DE | 689 27 038 T2 | 3/1997 |
| WO | WO 01/03292 A1 | 1/2001 |

* cited by examiner

*Primary Examiner*—Quochien B. Vuong
*Assistant Examiner*—Tuan H. Nguyen
(74) *Attorney, Agent, or Firm*—Eschweiler & Associates, LLC

(57) ABSTRACT

The invention relates to an apparatus and a method for stabilization of the transmission power of a radio during the active transmission phases thereof. Such stabilization is accomplished by measuring the power drop during the active transmission phase. The gain factor of the power amplifier associated with the apparatus is then raised during subsequent time slots, such that the measured power drop is compensated for precisely.

26 Claims, 3 Drawing Sheets

APPARATUS AND METHOD FOR STABILIZATION OF THE TRANSMISSION POWER OF RADIOS

RELATED APPLICATION

This application is a National Stage filing of International Application No. PCT/DE02/02450 filed Jul. 4, 2002, which is entitled "Apparatus and Method or Stabilization of the Transmission Power of Radios", which was not published in English, that claims priority to German Patent Application No. 101 32 352.2 filed on Jul. 4, 2001.

FIELD OF THE INVENTION

The invention relates to an apparatus for stabilization of the transmission power during the active transmission phases of a radio, in particular of a mobile radio, and to a mobile radio station having an apparatus such as this. The invention furthermore relates to a method for stabilization of the transmission power during the active transmission phases of radios.

BACKGROUND OF THE INVENTION

The effective radio-frequency transmission power of mobile radio stations is generally matched to various parameters relating to the transmission systems, for example to the distance between the mobile station and the base station, to the radio channel attenuation, to the noise on the radio channel, to the spectral characteristics of the radio channel, and to the transmission method, etc. There are various analog or digital control signals in the mobile station in order to adjust the radio-frequency transmission power, and these control the gain and the operating point of the power amplifier. In order to keep the desired transmission power constant over a specific time period, for example over one time slot, these control signals are often supplied as a control variable to a control system which is in the form of a control loop. In particular for mobile radio systems whose modulation signal has an envelope curve with a constant amplitude (for example GSM with GMSK modulation (Gaussian Minimum Shift Keying)), solutions are known from the prior art in which the transmission power is slaved to a predetermined nominal value with the aid of a control loop. The control system is in this case designed such that it can compensate for fluctuations in the battery voltage or thermal effects on the power amplifier, so that a constant power level, which corresponds to the control variable, is transmitted.

One such solution from the prior art is implemented in the PMB 6850, E-GOLD+V1.2 product from the applicant, which is commercially available.

In order to transmit higher data rates, modulation methods whose envelope curve does not have a constant amplitude will also be used in the future. This is the situation, for example, in the EDGE mobile radio standard, in which 3π/8-8-PSK modulation is used. A similar, but narrowband method is likewise used in places in North America, namely TIA/EIA-136 with π/4-DQPSK modulation. During the active part of the data transmission, that is to say during the active transmission phases, amplitude fluctuations of up to 15 dB occur with these methods. Owing to these amplitude fluctuations of the modulation signal, it is impossible with these modulation methods to use gain control in the form of a control loop to stabilize the transmission power. A control system such as this would to a certain extent partially compensate for the amplitude modulation and would thus lead to incorrect transmission.

If the battery voltage or the current output level now decreases owing to a decrease in capacity within a time slot, or if the efficiency of the power amplifier decreases during a time slot owing to thermal loading, or if the operating point of the power amplifier is shifted, then this results in a noticeable fall in the transmitted power during the course of the time slot. This effect is particularly noticeable at high transmission power levels, at which the battery or the rechargeable battery for the mobile radio briefly has to supply a current of several amperes.

In the solutions from the prior art, in which a modulation method whose amplitude was not constant was used, the power drop was either tolerated or was partially reduced by means of appropriately overdesigned battery buffering. Solutions such as these are also included in the PMB 6850, E-GOLD+V1.2 product.

SUMMARY OF THE INVENTION

The object of the invention is thus to provide an apparatus as well as a method for stabilization of the transmission power during the active transmission phases of a radio, which can also be used for modulation methods whose envelope curve does not have a constant amplitude.

According to the invention, this object is achieved by an apparatus for stabilization of the transmission power during the active transmission phases as claimed in claim 1, by a mobile radio station as claimed in claim 19, and by a method for stabilization of the transmission power during the active transmission phases as claimed in claim 21.

The apparatus according to the invention for stabilization of the transmission power during the active transmission phases of a radio, in particular of a mobile radio, has a sensor which measures the transmission power at specific measurement times during the active transmission phase. A system controller uses the values of the transmission power which are measured at specific measurement times to determine a power correction profile for the active transmission phase. A unit for gain factor correction corrects the gain factor during an active transmission phase in accordance with the power correction profile which has been determined for previous active transmission phases. The signals to be transmitted are amplified in accordance with the corrected gain factor during the active transmission phase by means of the power amplifier for the radio.

Thus, in the solution according to the invention, the power drop during an active transmission phase is recorded first of all. In order to compensate for this power drop, the gain factor is raised in accordance with the power correction profile during the active transmission phase. This makes it possible to ensure that the transmission power remains constant during a burst. Since the decrease in the transmission power during a burst is compensated for by appropriately raising the gain factor, the effective power gain within the active phase of a time slot is kept within specified limits. In particular, the kink in the battery voltage can be compensated for by the readjustment of the gain factor according to the invention, thus reducing the complexity for buffering of the batteries. This makes it possible to operate mobile radios with batteries of smaller capacity, thus making it possible to further reduce the weight and size of mobile radios.

The apparatus according to the invention for stabilization of the transmission power can be used equally well not only for signals with constant amplitude but also for signals whose amplitude is not constant. The GSM mobile radio system, which uses GMSK modulation, has a constant-amplitude envelope curve. The EDGE mobile radio systems, with 3π/8-8-PSK modulation as well as the TIA-/EIA-136 mobile radio system with π/4-DQPSK modulation, in contrast have an envelope curve whose amplitude is not constant. Independently of this, the solution according to the invention can be used for all the stated mobile radio systems and modulation methods.

A further advantage is that the apparatus according to the invention for stabilization of the transmission power is compatible with existing radio-frequency power amplifiers and their drive circuits. There is therefore no need for any modification to these circuit stages when using the solution according to the invention.

The apparatus according to the invention for stabilization of the transmission power allows the power correction profile to be determined during operation. The system-inherent measurement applies automatic self-adjustment and calibration of the transmission power, to be precise particularly for high transmission power levels.

Since the apparatus according to the invention requires only a single additional signal input for the power measurement signal which is supplied from the sensor, the additional hardware complexity for implementation of the apparatus according to the invention is low. The sensor already exists in any case in existing systems which have a conventional analog control system in the form of a control loop.

It is advantageous to measure the transmission power at the start and at the end of an active transmission phase. The two measured values obtained in this way can be used to deduce the power difference dP between the start and the end of the time slot. The determination of two measured values is sufficient to allow a linear approximation to the power drop to be implemented. The assumption of an approximately linear power drop may reflect the power drop that actually occurs sufficiently accurately, so that the power drop can be compensated for effectively on the basis of this assumption.

According to one advantageous embodiment of the invention, the transmission power is measured during each of the time intervals in which the tail bits are transmitted. The various mobile radio standards provide time intervals in which one and the same constant bit pattern is transmitted repeatedly. These sequences of so-called tail bits are typically arranged at the start and at the end of a time slot. Even in the case of modulation methods which do not have a constant envelope curve, the transmission amplitude remains constant during the transmission of the tail bits. These time intervals are therefore particularly suitable for determination of the transmission power.

It is advantageous for the measured values for the transmission power to be measured during the transmission mode when a connection is set up to a base station. If the transmission power is in each case measured at the start and at the end of an active transmission phase, then payload data can be transmitted independently of this during the active transmission phase. To this extent, the measurement of the transmission power can be integrated in the normal transmission mode.

It is advantageous for the system controller to use the values of the transmission power which are measured at specific measurement times to derive a correction value which represents the linearly approximated drop in the transmission power during the active transmission phase. The linearized power drop which occurs over a time slot can be represented by means of a single correction value. This correction value is passed to the unit for gain factor correction. This embodiment of the invention allows sufficiently accurate compensation for the power drop with minimal circuit complexity.

It is advantageous for the unit for gain factor correction to raise the gain factor of the power amplifier in accordance with the correction value during the active transmission phase in order to compensate for the drop in the transmission power. On the one hand, the correction value indicates the severity of the power drop considered over one time slot. On the other hand, however, the correction value also indicates the extent to which the gain factor of the power amplifier must be raised over one time slot in order to compensate for the power drop and to this extent to keep the transmission power level constant. The correction value which is obtained by analysis of the linearized power drop can to this extent be used directly as a manipulated variable for raising the gain factor.

In this case, it is advantageous for the system controller to convert the correction value to a control clock which is dependent on the correction value. This control clock is chosen to be at a higher rate the higher the correction value is. The introduction of a control clock such as this allows the gain factor to be raised continuously over a time slot in a particularly simple manner.

For this purpose, it is advantageous for the unit for gain factor correction to comprise a register as well as an adder, with the register content being incremented with each clock pulse of the control clock, and with the register content defining the gain factor of the power amplifier. A register and an adder make it simple to raise the gain factor of the power amplifier continuously by means of the control clock. For this purpose, the content of the register is incremented by one with each clock pulse of the control clock, with the register content defining the gain factor.

If the transmission power falls severely over a time slot, then the control clock is chosen to be at an appropriately high frequency so that the register content is raised at a high clock rate. In a corresponding manner, if the gain factor as defined by the register content were to rise to a major extent over a time slot, this would make it possible to completely compensate for the severe power drop.

Conversely, if there is only a small drop in the transmission power over a time slot, this would also lead only to a corresponding low frequency control clock, so that the register content would be incremented considerably more slowly. The described procedure allows the correction value to be converted in a simple manner and with little circuit complexity to a corresponding rise in the gain factor.

It is advantageous for the unit for gain factor correction to comprise a multiplexer which passes on to the power amplifier either the power ramp signal for raising or lowering the transmission power or the corrected gain factor which is produced by the unit for gain factor correction.

Before the transmission of a data burst, the transmission power must be raised by means of a continuous power ramp and must be lowered again after completion of the transmission process, because any abrupt change in the transmission power would lead to adjacent channel interference. In order to raise the transmission power, the power ramp generator produces a rising power ramp which is made available as a nominal value to the power amplifier. As soon as the maximum transmission power is reached, the multiplexer passes on the corrected gain factor, which is supplied by the unit for gain factor correction, to the power amplifier. From this time on, the gain factor is no longer governed by the power ramp generator.

After completion of the active transmission phase, the transmission power must be reduced again continuously. For this purpose, the multiplexer once again sets up a connection between the power ramp generator and the power amplifier. The transmission power is decreased to zero again in accordance with the falling power ramp that is now produced. This switching between rising and falling power ramps on the one hand and the corrected gain factor, which is produced by the unit for gain factor correction, on the other hand, makes it possible to ensure a continuous transmission burst power profile, avoiding abrupt changes in the transmission power. However, to do this, it is necessary to ensure that there is still a continuous function at the transition points between the power ramps and the corrected gain factor which is produced by the unit for gain factor correction. This can advantageously be achieved by the unit for gain factor correction being initialized for the switching process by using the final value of the rising power ramp. In a corresponding manner, the falling power ramp must start from the most recently supplied corrected gain factor.

According to one advantageous embodiment of the invention, any power control which may be provided for the power amplifier and which monitors in particular the raising and lowering of the transmission power is inactive during the active transmission phase, during which the gain factor is predetermined by the unit for gain factor correction. The power ramp generator provides the power ramps as nominal values for raising and lowering the transmission power. The actual transmission power is slaved to the nominal value profile, which is in the form of a ramp, by means of an analog power control system in the form of a control loop.

However, a closed-loop power control such as this based on the use of a control loop breaks down during the active transmission phase in the case of modulation methods in which the envelope curve does not have constant amplitude. The analog closed-loop power control must thus be switched to be inactive during the active transmission phase. During the active transmission phase, a change takes place from closed-loop power control to open-loop power control, in which the unit for gain factor correction monitors the gain factor directly without the interposition of a control loop, instead of presetting it as a nominal value.

After completion of the active transmission phase, the transmission power is reduced by means of a falling power ramp. This can optionally be done by means of open-loop or closed-loop control. If the signal power level is reduced by means of open-loop power control, the power ramp generator presets the power ramp for reducing the transmission power without the interposition of a control loop, and directly controls the gain factor of the power amplifier.

As an alternative to this, it is also possible after completion of the active phase to change from open-loop power control to closed-loop power control and to once again activate the analog closed-loop power control which is in the form of a control loop. The falling power ramp that is produced by the power ramp generator is then used as a nominal value for the transmission power, and the closed-loop power control slaves the transmission power to this nominal value.

According to one advantageous embodiment of the invention, the sensor comprises a power coupler which outputs a fraction of the transmission power in order to determine a power measurement signal. A power coupler such as this can be used to record the transmission power level that actually occurs at the antenna. The power measurement signals which are obtained in this way are used to determine the power drop which occurs during a time slot.

In this case, it is advantageous for the sensor to comprise a rectifier element, which rectifies the output signal. The transmission signal is a radio-frequency AC voltage signal which must be rectified before it is used as a power measurement signal. Rectifier diodes are preferably used for this purpose.

In one advantageous embodiment of the invention, the sensor has a low-pass filter. The low-pass filter allows pulse spikes in the rectified power measurement signal to be eliminated. In this way, the rectified signal is smoothed.

It is advantageous for the output power measurement signal to be subjected to linearization. Owing to the diode characteristic of the rectifier diodes, the relationship between the transmission power and the power measurement signal is not linear. Subjecting the output signal to linearization before using it as a power measurement signal results in more uniform resolution.

It is advantageous for the apparatus to comprise a measurement device which amplifies the power measurement signal which is supplied from the sensor. The amplified power measurement signal can then be used to determine the correction value. For this purpose, the measurement device may additionally comprise an analog/digital converter for digitization of the amplified power measurement signal.

It is advantageous for the measurement device to comprise a differential amplifier as well as a controllable crossover switch, wherein the controllable crossover switch makes it possible to reverse the mathematical sign of the potential difference which is to be amplified. The controllable crossover switch can be used to interchange the input signals to the differential amplifier. By carrying out two measurements with different switch positions in each case, it is possible to eliminate by calculation any undesirable offset which occurs in the measurement path. This makes it possible to record the respective power measurement signals with better accuracy.

According to a further advantageous embodiment of the invention, the apparatus comprises an event controller, which controls the power ramps for raising and lowering the transmission power and which predetermines the measurement times at which the sensor measures the transmission power during the active transmission phase. The object of the event controller is central time coordination of the power ramps, of the signal modulation and of the measurement times at which the transmission power is recorded. The control of the transmission power can be synchronized to the actual transmission process with the aid of a central sequence controller which initiates the various events by means of trigger signals.

It is advantageous for the unit for gain factor correction to be integrated in the semiconductor module which produces the baseband signals which are to be transmitted. In addition, the power ramp generator as well as the multiplexer can also be accommodated in the baseband module, with the multiplexer optionally passing on the power ramp signal or the corrected gain factor which is produced by the unit for gain factor correction. A single control variable can then be made available as the output signal from the baseband module for the power amplifier, either presetting the nominal value or directly presetting the gain factor for the power amplifier.

If the unit for gain factor correction is accommodated in the baseband module, the number of signal lines between the baseband module and the radio-frequency module can be reduced to a minimum. After the digitization of the power measurement signal, the majority of the signal processing can be carried out in digital form in the baseband module. In particular, the unit for gain factor correction may be in the form of a digital signal processing stage or may be formed by means of a digital signal processor, so that it is also possible from this point of view to integrate the unit for gain factor correction in the baseband module.

The invention is particularly suitable for use in mobile radio stations. In the case of mobile radios, the brief very high current drawn of up to several amperes during the transmission process leads to a considerable kink in the supply voltage which is provided by the generally physically small rechargeable battery.

According to one advantageous refinement of the invention, the data is transmitted in the mobile radio station in accordance with one of the Standards GSM, EDGE, TIA-/EIA-136 or in accordance with partial combinations of these Standards. Particularly in the case of the EDGE standard, in which $3\pi/8$-8-PSK modulation is used, and in the case of the TIA-/EIA-136 standard, in which $\pi/4$-DQPSK modulation is used, the use of the solution according to the invention is advantageous, because the envelope curve of the transmitted signals does not have a constant amplitude in this case. The GSM Standard, on the other hand, uses GMSK modulation, whose envelope curve does have a constant amplitude. The solution according to the invention can also be used for modulation methods such as these. This makes the use of the invention particularly interesting for mobile radios which support two or more modulation methods.

In the method according to the invention for stabilization of the transmission power during the active transmission phases of radios, in particular of mobile radios, the actual transmission power is measured in a first step, at specific measurement times during the active transmission phase. A power correction profile is then determined for the active transmission phase on the basis of the measured values of the transmission power. The gain factor is then corrected in accordance with the power correction profile which was determined for previous active transmission phases. The signals which are to be transmitted during the active transmission phase are then amplified in accordance with the corrected gain factor.

By measuring the power drop for previous active transmission phases, it is possible to find out the way in which the gain factor must be increased during the course of an active transmission phase in order to compensate for the transmission power drop. Appropriately raising the gain factor in the course of the active transmission phase makes it possible to ensure that the transmission power is constant over the entire time slot without needing to use a closed-loop analog power control system, which is based on the control loop principle, for this purpose. Such closed-loop power control systems which are based on the control loop principle cannot be used for modulation methods whose envelope curve is not constant.

DETAILED DESCRIPTION OF THE INVENTION

The invention will be described in more detail in the following text with reference to an exemplary embodiment which is illustrated in the drawing, in which.

DETAILED DESCRIPTION OF THE INVENTION

Figure 1:
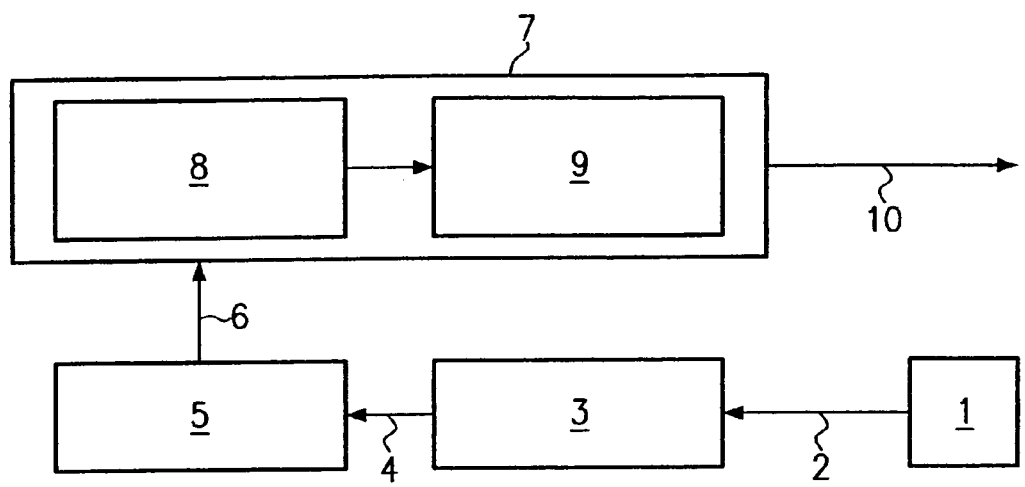
FIG. 1 shows a block diagram of the apparatus according to the invention for stabilization of the transmission power.

FIG. 1 shows the basic functional principle of the invention in the form of a block diagram. The sensor 1 is used to output a portion of the radio-frequency transmission signal, and to convert it to a power measurement signal 2. The power measurement signal 2 is recorded at defined measurement times, is amplified and is digitized in the measurement device 3. The digitized measurement signal 4 which is recorded at various measurement times during a time slot is used by the system controller 5 to calculate the transmission power drop during an active transmission phase. This power drop results directly in the profile of the power correction which is required in order to achieve a constant output transmission power.

In the simplest embodiment of the invention, the power drop is approximated linearly and is represented by the correction value 6. The correction value 6 is supplied to the power amplifier controller 7, which comprises the power ramp generator 8 as well as the unit for gain factor correction 9. The power ramp generator 8 produces the power ramps which are required for raising and lowering the transmission power. After the raising of the transmission power, during the active transmission phase, the gain factor of the power amplifier is raised continuously in accordance with the correction value 6 by means of the unit for gain factor correction 9, in order to compensate for the transmission power drop which occurs during data transmission. The greater the extent to which a power drop occurs during a time slot, the greater is the extent to which the gain factor is raised in the course of the subsequent active transmission phases. The unit for gain factor correction 9 produces the control variable 10 for the power amplifier, and this directly defines the gain factor of the power amplifier.

Figure 2:
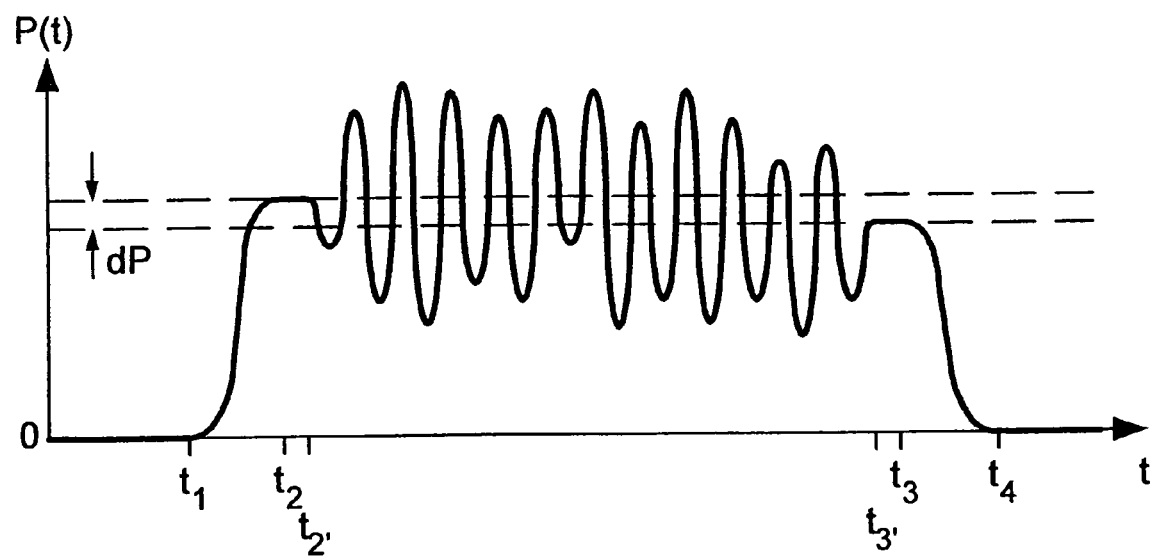
FIG. 2 shows the time profile of the transmission power during the transmission of a data burst when using a modulation method whose envelope curve is not constant.

FIG. 2 shows the profile of the transmission power P(t) during transmission of a data burst, as a function of time. In this case, the data burst is transmitted using a modulation method whose envelope curve has a varying amplitude. Before it is possible to start to transmit payload data, the transmission power must first of all be raised continuously by means of an upward ramp from zero to the transmission power which is used for data transmission. The upward ramp starts at the time $t_1$; the transmission power that is required for transmission is reached at the time $t_2$. The closed-loop analog power control system is active during the upward ramp. The transmission power which is produced by the power amplifier is in this case slaved by means of a control loop to the upward ramp which is preset as a nominal value profile.

After passing through the upward ramp, the closed-loop analog control system is switched to be inactive.

A sequence of tail bits is transmitted before the actual payload data transmission, between the times $t_2$ and $t_{2'}$.

For this reason, the amplitude of the envelope curve of the transmitted signal remains constant during the time interval between $t_2$ and $t_{2'}$. The transmission of the payload data starts from the time $t_{2'}$. The transmission of the payload data, which ends at the time $t_{3'}$, is followed by a time interval during which a sequence of tail bits is once again transmitted. During this time interval between the times $t_{3'}$ and $t_3$, the amplitude of the envelope curve thus once again remains constant.

The downward ramp, by means of which the transmission power is reduced to zero while avoiding any abrupt changes, starts at the time $t_3$. The closed-loop analog power control system is reactivated for this purpose. The transmission power is reduced to zero again at the time $t_4$, at the end of the downward ramp.

The power drop dP in the transmission power which occurs within a time slot is obtained as the difference between the transmission power at the start and at the end of the data burst. This is done by determining the initial transmission power during the time interval between $t_2$ and $t_{2'}$. The transmission power at the end of the data burst is measured during the transmission of the final tail-bit sequence, that is to say during the time interval between $t_{3'}$ and $t_3$.

Figure 3:
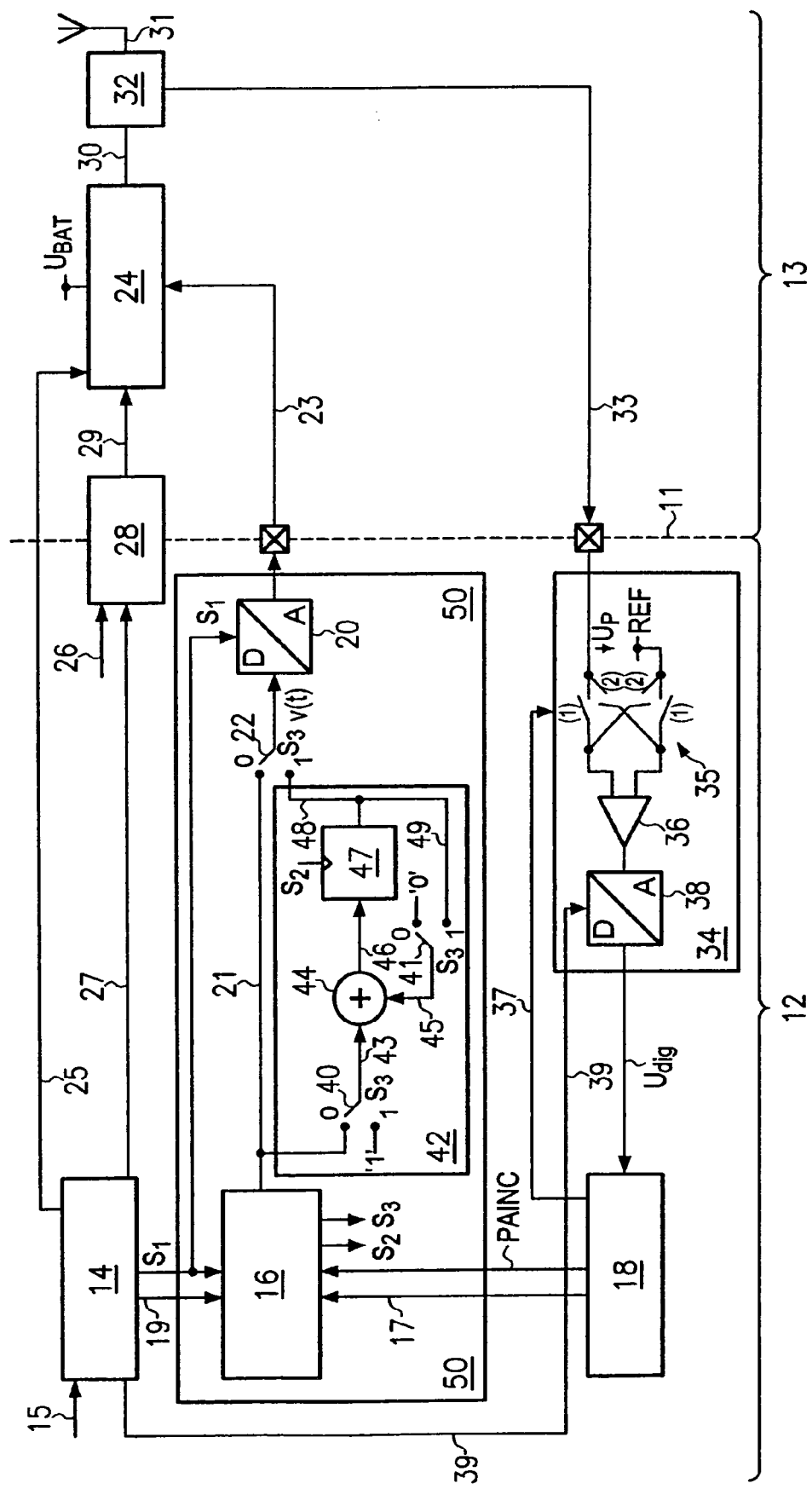
FIG. 3 shows a more detailed circuit diagram of a transmission apparatus with the unit according to the invention for gain factor correction.

FIG. 3 illustrates the configuration of the apparatus according to the invention for stabilization of the transmission power, in the order of a block diagram. All the assemblies which are arranged to the left of the module boundary 11 are integrated in the baseband module 12, while those assemblies which are shown on the right-hand side of the module boundary 11 are located in the radio-frequency module or modules 13. The event controller 14 is arranged in the baseband module 12 and is responsible for the time synchronization and coordination of the various signals which are required for transmission of a data burst. The event controller 14 operates using a system clock 15 which is synchronized to the transmission system.

The power ramps which are required for raising and lowering the transmission power are produced by the power ramp generator 16 as a sequence of digital values. The data 17 for the power ramps is in this case provided by the system controller 18. The time control of the sequence of the power ramps is achieved by means of the synchronization signal 19, which is transmitted from the event controller 14 to the power ramp generator 16. The event controller 14 also transmits the periodic clock signal S1 to the power ramp generator, and this signal is also made available to the digital/analog converter 20.

The power ramp generator 16 uses these signals to produce the actual power ramp signal 21, which is applied via the multiplexer 22, as a digital result signal v(t), to the input of the digital/analog converter 20.

Figure 4:
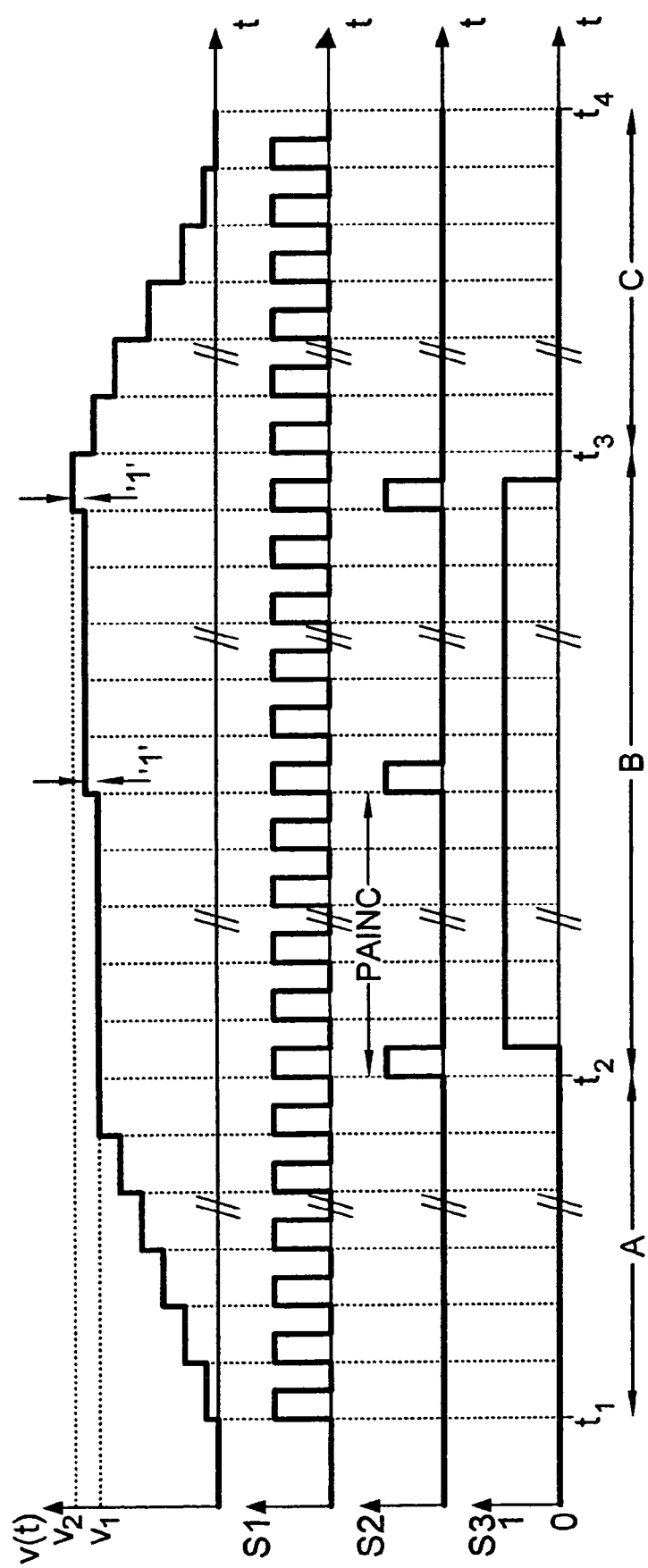
FIG. 4 shows the time profile of the control signals v(t), S1, S2 and S3.

FIG. 4 shows the time profile of the digital result signal v(t) and of the clock signal S1. In the time interval A between the times $t_1$ and $t_2$, the transmission power is raised from zero to the value $v_1$ in the form of an upward ramp. Within this time interval A, the digital result signal v(t) corresponds to the power ramp signal 21. The digital/analog converter 20 converts the digital result signal v(t) to the analog control variable 23 for the power amplifier. This conversion process is clocked by the clock signal S1 which is applied to the digital/analog converter 20.

The analog control variable 23 is passed from the baseband module 12 to the power amplifier 24, which is located in the radio-frequency module 13. While the transmission power is being raised, the analog control variable 23 is used as a nominal value for the gain of the power amplifier 24. In order to make it possible to follow the respective power gain of the predetermined nominal variable, the power amplifier 24 comprises a closed-loop analog power control system, which is in the form of a control loop and which is active while the transmission power is being raised and lowered. This closed-loop analog control system for the power amplifier 24 can be switched on and off by the event controller 14 via the control line 25. The power amplifier 24 draws the energy that is required for the amplification process from the battery or from the rechargeable battery of the mobile radio, with the battery supplying the voltage $U_{BAT}$.

The upward ramp ends at the time $t_2$, at which time the active transmission phase starts, which is denoted B in FIG. 4. For this purpose, the event controller 14 first of all switches the closed-loop analog control system for the power amplifier 24 to be inactive, via the control line 25. The data 26 to be transmitted and the synchronization signal 27 which is generated by the event controller 14 are supplied to the modulator 28, which uses them to produce the modulated signal 29. The synchronization signal 27 is used to coordinate the transition between the start and the end of the power ramps on the one hand and the data transmission on the other hand. The modulated signal 29 is supplied to the power amplifier 24, which uses this modulated signal 29 to produce the radio-frequency transmission signal 30, which is transmitted via the antenna 31.

The transmission path contains the sensor 32 which outputs a portion of the radio-frequency transmission signal 30 and supplies this to a rectifier diode with a downstream low-pass filter. The low-pass filter allows pulse spikes to be eliminated, in order to smooth the rectified signal. This results in the analog power measurement signal 33. Owing to the diode characteristic, the relationship between the transmission power and the power measurement signal is not linear. However, the relative sensitivity of the sensor 32 is greater for high transmission power levels and is thus particularly high in the area of interest, in which the actual transmission power correction is intended to be carried out, so that this nonlinearity is acceptable. However, the power measurement signal 33 may also be subjected to linearization in order to obtain uniform resolution.

The analog power measurement signal 33 is passed from the radio-frequency module 13 to the baseband module 12, and from there to the measurement device 34. Compared with the solutions from the prior art, only one additional signal pin is required for this purpose. The potential difference $U_P$ between the power measurement signal 33 and the reference potential REF is amplified in the measurement device 34. The ground potential is particularly suitable for use as the reference potential REF. The two inputs of the high-impedance differential amplifier 36 can be interchanged with the aid of the controllable crossover switch 35, in order in this way to make it possible to calculate and to correct for the offset occurring in the measurement path. Two measurements are in this case carried out successively for each measured value to be recorded. The switches which are denoted (1) in the crossover switch 35 are closed, while the switches which are denoted (2) are open for the first of the two measurements. In a corresponding manner, the switches which are denoted (2) are closed and the switches which are denoted (1) are opened for the second measurement. The controllable crossover switch 35 is monitored by the system controller 18 via the control line 37.

The amplified analog signals which are produced in the output of the differential amplifier 36 are supplied to the analog/digital converter 38, at whose output the digitized power measurement signal $U_{dig}$ can be tapped off. The relationship between the potential difference $U_P$ at the input of the measurement device 34 and the digitized power measurement signal $U_{dig}$ is in this case defined by the equation:

$$U_{dig} = g_{ADC} \cdot g_S \cdot U_P + U_{dig,0}$$

In this case, $g_S$ denotes the gain of the differential amplifier 36, while $g_{ADC}$ denotes the gain of the analog/digital converter 38. $U_{dig,0}$ denotes the digital value which is associated with the potential difference $U_P=0V$. In consequence, the voltage $U_P$ becomes:

$$U_P = \frac{U_{dig} - U_{dig,0}}{g_{ADC} \cdot g_s}.$$

The variable $U_{dig,0}$ denotes the digital value which is associated with the potential difference $U_P=0V$, and to this extent represents the offset which occurs in the measurement path and which is caused by the differential amplifier 36 and by the analog/digital converter 38. Since two successive measurements are carried out for each potential difference $U_P$ to be determined, with the inputs of the differential amplifier 36 being interchanged by means of the crossover switch 35, the variable $U_{dig}$, can be determined, and can then be eliminated by calculation.

The transmission power is in each case measured at the start and at the end of the active transmission period, during the transmission of the tail bits. With reference to FIG. 2, the first power measurement is carried out between the times $t_2$ and $t_{2'}$, while the second power measurement is carried out between the times $t_{3'}$ and $t_3$. The measurement times are in this case preset by the event controller 14 via the trigger signal 39 which is supplied to the analog/digital converter 38. The crossover switch 35 is monitored during this process by the system controller 18 via the control line 37. The important factor is for the components in the measurement path, which comprises the sensor 32, the controllable crossover switch 35, the differential amplifier 36 as well as the analog/digital converter 38 to be dimensioned such that stabilization is possible during the available measurement time. In the EDGE Standard, these time intervals are approximately 4 os.

The digitized power measurement signals $U_{dig}$ which are associated with the respective measurements are supplied to the system controller 18 which uses them to determine the transmission power drop dP which has occurred within a time slot, and to convert these to the correction value PAINC. This correction value PAINC indicates the way in which the gain of the power amplifier 24 must be raised during the active transmission phase. A large PAINC value in this case corresponds to only a small increase in the power gain during the active transmission phase, while a small value of PAINC indicates that the gain must be raised to a major extent during the active transmission phase.

The correction value PAINC which is determined by the system controller 18 is supplied to the power ramp generator 16. In the time interval A between $t_1$ and $t_2$, the power ramp generator 16 produces a rising power ramp, which is passed as the power ramp signal 21 via the multiplexer 22 to the digital/analog converter 20. The multiplexer 22 is in this case monitored by the signal S3, which is likewise produced by the power ramp generator 16. FIG. 4 shows the time profile of this signal. The signal S3 is "0" during the phase A, that is to say between the times $t_1$ and $t_2$. The signal S3 changes from "0" to "1" at the time $t_2$, that is to say at the start of the active transmission phase B. The value of the signal S3 is "1" throughout the entire active transmission phase. The signal S3 is "0" once again between the times $t_3$ and $t_4$, that is to say during the phase C in which the power ramp generator 16 is producing the downward ramp.

Both the multiplexer 22 and the changeover switches 40 and 41 within the unit 42 for gain factor correction are controlled by the signal S3. During the rising and falling transmission ramps, the multiplexer 22 passes on the power ramp signal 21 to the digital/analog converter 20. The power ramp signal is also passed via the changeover switch 40 and the signal line 43 to the adder 44. The value "0" is passed via the changeover switch 41 and via the signal line 45 to the adder 44, and to this extent contributes nothing to the summation result. The sum signal 46 from the adder 44 is stored in the register 47.

The closed-loop analog control system for the power amplifier 24, which was active during the upward ramp, is deactivated via the control line 25 at the time $t_2$. This means that the last valid value of the manipulated variable which the closed-loop analog control system produced is maintained, and now follows the control variable 23. The closed-loop control system is thus, so to speak, "frozen". Pure unidirectional control is used during the active transmission phase, rather than a closed-loop analog control system with the aid of a control loop.

From the time $t_2$, the result signal 48 from the unit 42 for gain factor correction is passed via the multiplexer 22 as the digital result signal v(t) to the input of the digital/analog converter 20, which converts the digital result signal v(t) to the analog control variable 23 for the power amplifier. The unit for gain factor correction 42, the power ramp generator 16, the multiplexer 22 and the digital/analog converter 20 together form the power gain controller 50.

Since the signal S3 is "1" from the time $t_2$, the value "1" is applied to the first input of the adder 44 via the changeover switch 40 and the signal line 43. The content of the register 47 is passed via the feedback line 49, the changeover switch 41 and the signal line 45 to the second input of the adder 44. The adder 44 adds the value "1" to the content of the register 47. The content of the register 47 incremented by one is therefore produced at the output of the adder 44. This register content incremented by one is supplied via the signal line 46 to the register 47.

The signal value which is applied to the input of the register is transferred as the new register content to the register 47 with each clock cycle of the control clock S2. The content of the register 47 is thus incremented by one with each clock pulse of the control clock S2. As can be seen from FIG. 4, this results from the time $t_2$ in a relatively slowly rising linear ramp for the digital result signal v(t). In the profile of this linear ramp, which is used to compensate for the power drop, v(t) rises from the initial value $v_1$ to the final value $v_2$. FIG. 4 also shows how the value of v(t) is incremented by one with each clock pulse of the control clock S2. The interval between the clock pulses of the control clock S2 is in this case predetermined by the correction value PAINC. The correction value PAINC indicates the number of clock cycles of S1 signal which will occur between two clock pulses of the S2 signal. The greater PAINC, the more rarely is the content of the register 47 incremented; the power rise during the active phase is then correspondingly flat. A power ramp such as this is sufficient to compensate for a small power drop dP. If, on the other hand, a severe power drop dP occurs within the active transmission phase, then the correction value PAINC which is calculated by the system controller 18 has a relatively small value. This leads to a high clock rate of the control clock S2 and, to this extent, to a major power rise within the active transmission phase.

In general, the system controller 18 calculates the correction value PAINC using the formula:

$$v_2 - v_1 = \text{floor}\left[\frac{\frac{t_3 - t_{2'}}{T_{S1}} - 1}{PAINC}\right]$$

In this case, $v_1$ denotes the digital initial value of the power rise during the active transmission phase, which corresponds to the digital final value of the upward ramp. $v_2$ denotes the digital final value of the power rise during the active transmission phase. The time duration of the active transmission phase is defined by the time interval ($t_3-t_{2'}$). $T_{S1}$ represents the period duration of the clock signal S1, and the operator "floor" denotes the integer operator, which cuts off the digits after the decimal point in its argument. The difference ($v_2-v_1$) is selected in the system controller 18 as a function of the power drop dP and/or as a function of the measured value difference. The correction value PAINC can then be determined from the stated equation.

At the end of the active period of the time slot, that is to say at the time $t_3$, the closed-loop analog control system is switched on again by the event controller 14 via the control line 25. The signal S3 once again assumes the value "0", and the power ramp generator 16 produces the downward ramp as a consequence of digital values. In FIG. 4, the phase during which the downward ramp is produced is denoted C. The power ramp signal 21 is passed via the multiplexer 22 as the digital result signal v(t) to the digital/analog converter, where it is converted to the analog control variable 23.

However, it is optional to switch the control loop on again by means of the control line 25 at the end of the active transmission period. Since, frequently, there is no need to achieve an exactly defined power level at the end of the downward ramp (that is to say at the time $t_4$), it is not absolutely essential to have a closed-loop control system here. Thus, during the downward ramp, unidirectional control can alternatively be carried out in the same way as within the active period of the time slot. This also avoids transients which may possibly occur at the time $t_3$ if there are any initial control differences when the control loop is switched on.

The invention claimed is:

1. An apparatus for stabilization of transmission power during an active transmission phase of a radio having an inactive transmission phase arranged between subsequent active transmission phases, comprising:
   a sensor adapted to measure a transmission power at predetermined measurement times associated with the active transmission phases;
   a system controller adapted to determine a power correction profile for the active transmission phases using the measured transmission power;
   a gain factor correction unit adapted to correct a gain factor of the apparatus during the active transmission phases in accordance with the determined power correction profile associated with a previous active transmission phase, the active transmission phases being separated by an inactive transmission phase associated with a reduced transmission power; and
   a power amplifier operable to amplify a transmission signal during the active transmission phases in accordance with the corrected gain factor, and to reduce the transmission power in the inactive transmission phase with respect to the transmission power during the active transmission phases.

2. The apparatus of claim 1, wherein the transmission power is measured at the start and at the end of an active transmission phase.

3. The apparatus of claim 2, wherein the transmission power is measured during time intervals in which tail bits are transmitted.

4. The apparatus of claim 1, wherein the transmission power is measured during a transmission mode when a connection is set up to a base station.

5. The apparatus of claim 1, wherein the system controller uses the transmission power that is measured at the predetermined measurement times to derive a correction value that represents a linearly approximated drop in the transmission power during the active transmission phases.

6. The apparatus of claim 5, the gain factor correction unit raises the gain factor of the power amplifier in accordance with the correction value during the active transmission phases in order to compensate for the drop in the transmission power.

7. The apparatus of claim 5, wherein the system controller converts the correction value to a control clock signal that is dependent on the correction value.

8. The apparatus of claim 7, wherein the gain factor correction unit comprises a register and an adder, wherein the register content is incremented with each clock pulse of the control clock signal, and wherein the register content defines the gain factor of the power amplifier.

9. The apparatus of claim 1, further comprising a multiplexer that selectively transmits to the power amplifier either a power ramp signal for raising or lowering the transmission power, or the corrected gain factor that is produced by the unit for gain factor correction.

10. The apparatus of claim 1, wherein the power amplifier is further operable to provide an analog power control signal that reflects a raising or lowering of the transmission power, and wherein the analog power control signal is inactive during the active transmission phases during which the gain factor is predetermined by the gain factor correction unit.

11. The apparatus of claim 1, wherein the sensor comprises a power coupler that outputs a fraction of the transmission power to determine a power measurement signal.

12. The apparatus of claim 11, wherein the sensor further comprises a rectifier element that rectifies an output signal thereof.

13. The apparatus of claim 11, wherein the sensor further comprises a low-pass filter.

14. The apparatus of claim 11, wherein the power measurement signal is subjected to linearization.

15. The apparatus of claim 11, wherein the apparatus further comprises a measurement device that amplifies the power measurement signal that is supplied from the sensor.

16. The apparatus of claim 15, wherein the measurement device comprises a differential amplifier coupled to a controllable crossover switch, wherein the controllable crossover switch is operable to selectively reverse a polarity of a potential difference that is to be amplified.

17. The apparatus of claim 1, further comprising an event controller that controls a power ramp for raising and lowering the transmission power, and that predetermines the measurement times at which the sensor measures the transmission power during the active transmission phases.

18. The apparatus of claim 1, wherein the gain factor correction unit is integrated into a semiconductor module that produces the baseband signals that are to be transmitted.

19. A method for stabilization of transmission power during an active transmission phase of a radio having an inactive transmission phase arranged between subsequent active transmission phases, comprising:
- measuring the transmission power at predetermined measurement times associated with the active transmission phases;
- determining a power correction profile for the active transmission phases based on the measured transmission power;
- correcting a gain factor in accordance with the power correction profile that has been determined for a previous active transmission phase, the active transmission phases being separated by an inactive transmission phase associated with a reduced transmission power; and
- amplifying signals to be transmitted during the active transmission phases in accordance with the corrected gain factor, and reducing the transmission power in the inactive transmission phase with respect to the transmission power during the active transmission phases.

20. The method of claim 19, wherein measuring the transmission power comprises measuring at the start and at the end of an active transmission phase.

21. The method of claim 19, wherein measuring the transmission power comprises measuring during each of the time intervals in which tail bits are transmitted.

22. The method of claim 19, further comprising deriving a correction value that represents a linearly approximated drop in the transmission power during the active transmission phases.

23. The method of claim 22, wherein correcting the gain factor comprises raising the gain factor during the active transmission phases corresponding to the correction value in order to compensate for a drop in the transmission power.

24. The method of claim 19, wherein amplifying the signals further comprises employing either a power ramp signal for raising or lowering the transmission power or employing the corrected gain factor in order to define the gain of a power amplifier.

25. The method of claim 19, further comprising deactivating an analog power control signal that reflects a raising or lowering of the transmission power during the active transmission phases during which the gain factor is predetermined by the gain factor correction unit.

26. The method of claim 19, further comprising:
- outputting a fraction of the transmission power; and
- determining a power measurement signal based on the fraction.

* * * * *